United States Patent
Wang et al.

(10) Patent No.: US 7,265,065 B2
(45) Date of Patent: Sep. 4, 2007

(54) METHOD FOR FABRICATING DIELECTRIC LAYER DOPED WITH NITROGEN

(75) Inventors: Yun-Ren Wang, Tai-Nan (TW); Ying-Wei Yen, Miao-Li Hsien (TW); Chien-Hua Lung, Hsin-Chu County (TW); Kuo-Tai Huang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 68 days.

(21) Appl. No.: 10/908,157

(22) Filed: Apr. 29, 2005

(65) Prior Publication Data

US 2006/0246739 A1    Nov. 2, 2006

(51) Int. Cl.
*H01L 21/318* (2006.01)
(52) U.S. Cl. ...................... 438/792; 438/775
(58) Field of Classification Search ......... 438/775, 438/791, 792
See application file for complete search history.

(56) References Cited

U.S. PATENT DOCUMENTS

| | | | |
|---|---|---|---|
| 6,362,085 B1 | 3/2002 | Yu | |
| 6,649,538 B1 * | 11/2003 | Cheng et al. | 438/775 |
| 7,138,691 B2 | 11/2006 | Burnham | |
| 7,176,094 B2 | 2/2007 | Zhong | |
| 2003/0082863 A1 | 5/2003 | Lim | |
| 2004/0188240 A1 | 9/2004 | Chang | |

FOREIGN PATENT DOCUMENTS

| | | |
|---|---|---|
| TW | 200304177 | 9/2003 |
| TW | 578270 | 3/2004 |
| TW | 1230980 | 4/2005 |
| TW | 200536055 | 11/2005 |

* cited by examiner

*Primary Examiner*—M. Wilczewski
*Assistant Examiner*—Pamela E Perkins
(74) *Attorney, Agent, or Firm*—Winston Hsu

(57) ABSTRACT

A method for fabricating a dielectric layer doped with nitrogen is provided according to the present invention. According to the method, a dielectric layer is formed on a semiconductor substrate. Two steps of nitridation processes are then performed on the dielectric layer. Following that, one step or two steps of annealing processes are performed on the dielectric layer. Dielectric layer formed by the method has uniform nitrogen dopant, and thus has fine electric properties.

12 Claims, 3 Drawing Sheets

METHOD FOR FABRICATING DIELECTRIC LAYER DOPED WITH NITROGEN

BACKGROUND OF INVENTION

1. Field of the Invention

The invention relates to a method for fabricating a dielectric layer doped with nitrogen, and more particularly, to a method for fabricating a gate oxide layer doped with nitrogen uniformly.

2. Description of the Prior Art

In order to increase the integrity of a single wafer, semiconductor elements are made smaller and more compact. However, for higher performance, the thickness of a gate oxide layer of a complementary metal oxide (CMOS) device is decreased to maintain the capacitance between a gate and a channel. This is because the bigger the capacitance, the smaller the electric field within the gate oxide layer, and while the electric field is small, current leakage is prevented. For example, in a semiconductor process beyond 130 nm, an oxide gate layer smaller than 20 angstroms is required to achieve good performance.

Generally, silicon oxide is used as a gate oxide layer. However, thin layer of silicon oxide cannot meet the requirements of high dielectric constant, stable thermal properties, high breakdown voltage, and small current leakage. For example, leakage currents may occur in silicon oxide layers with thickness smaller than 50 angstroms due to electrons and holes tunneling through the energy barrier of the silicon oxide layer. To fix this shortcoming, nitrogen is doped into the silicon oxide layer so as to increase the dielectric constant of the silicon oxide layer. As a result, a gate oxide layer with the same capacitance and larger physical thickness, i.e. a gate oxide layer with the same equivalent oxide thickness (EOT), is formed.

In the prior art, there are at least two methods to dope nitrogen into a gate oxide layer. The first one is to thermally grow a gate oxide layer in a nitride ambiance, such as by a rapid thermal oxidation (RTO) process performed in nitrogen oxide ambiance, or by a thermal oxidation process performed in ammonia ambiance. Nevertheless, such a thermal growth process may lead to low nitrogen concentration in the oxide layer, or current leakage due to hydrogen diffusion into the oxide layer.

Another way to dope a gate oxide layer with nitrogen is by a plasma nitridation process, such as a single step decoupled plasma nitridation (DPN) process. In a DPN process, a plasma nitridation process and an annealing process are performed to form an oxide layer with an EOT smaller than 11 angstroms. The DPN process not only decreases the current leakage efficiently, but also offers a better barrier to boron, so as to facilitate the performance of a transistor.

However, uniformity of thickness and uniformity of nitrogen dopants in a gate oxide layer cannot be reached using a single step DPN process. More particularly, the nitrogen distribution is nonuniform around the center of the wafer. In addition, the average uniformity is not satisfying. Taking a 90 nm process as an example, gate oxide layer doping by a DPN process has nitrogen uniformity of about 8.1%. Since the nitrogen distribution is non-uniform, the capacitance, threshold voltage and other electric properties of a wafer are affected. Therefore the yield of the wafer may be decreased. As a result, a method to improve the uniformity of the nitrogen distribution in an gate oxide layer is required to increase the yield.

SUMMARY OF INVENTION

It is therefore a primary object of the claimed invention to provide a method for fabricating a dielectric layer doped with nitrogen, so as to solve the above problem of nitrogen distribution being nonuniform in a gate oxide layer.

According to the claimed invention, a method for fabricating a dielectric layer doped with nitrogen is disclosed. According to the method, a dielectric layer is formed on a semiconductor substrate, and two nitridation processes are performed to the dielectric layer. The nitridation processes are decoupled plasma nitridation (DPN) processes. The DPNs are performed with a device having a dual coil configuration, wherein the current ratio of the coils is adjustable. The current ratio changes in different steps of the nitridation processes. After the nitridation processes, a low-temperature annealing process is performed on the dielectric layer. Following that, a high-temperature annealing process is performed on the dielectric layer The method according to the present invention uses two nitridation processes and annealing processes to improve the uniformity of the nitrogen in an oxide layer, so as to assure the quality of the semiconductor elements and improve the yield of the wafer.

These and other objectives of the present invention will no doubt become obvious to those of ordinary skill in the art after reading the following detailed description of the preferred embodiment that is illustrated in the various figures and drawings.

DETAILED DESCRIPTION

In the prior art, oxide layers doped with nitrogen are formed with a single step nitridation process followed by annealing processes. In such a process, the improvement in uniformity of the nitrogen in a gate oxide layer is limited. Therefore, the present invention provides a method for fabricating a gate oxide layer doped with nitrogen using two nitridation processes and two annealing processes, to improve the uniformity of the nitrogen in an oxide layer more efficiently.

Decoupled plasma nitridation (DPN) is a technique that uses a device with a double coil configuration to perform a plasma nitridation process. The double coil configuration comprises an inner coil and an outer coil, wherein the current ratio of the two coils is adjustable, so as to form various divider capacitor settings. By adjusting the divider capacitor setting, the concentration of nitrogen dopants is controlled. However, this kind of dual coil configuration exists not only in DPN devices but also plasma process devices, etchers, or plasma enhanced chemical vapor deposition (PECVD) devices. Therefore, DPN may also be performed with such devices.

Figure 1:
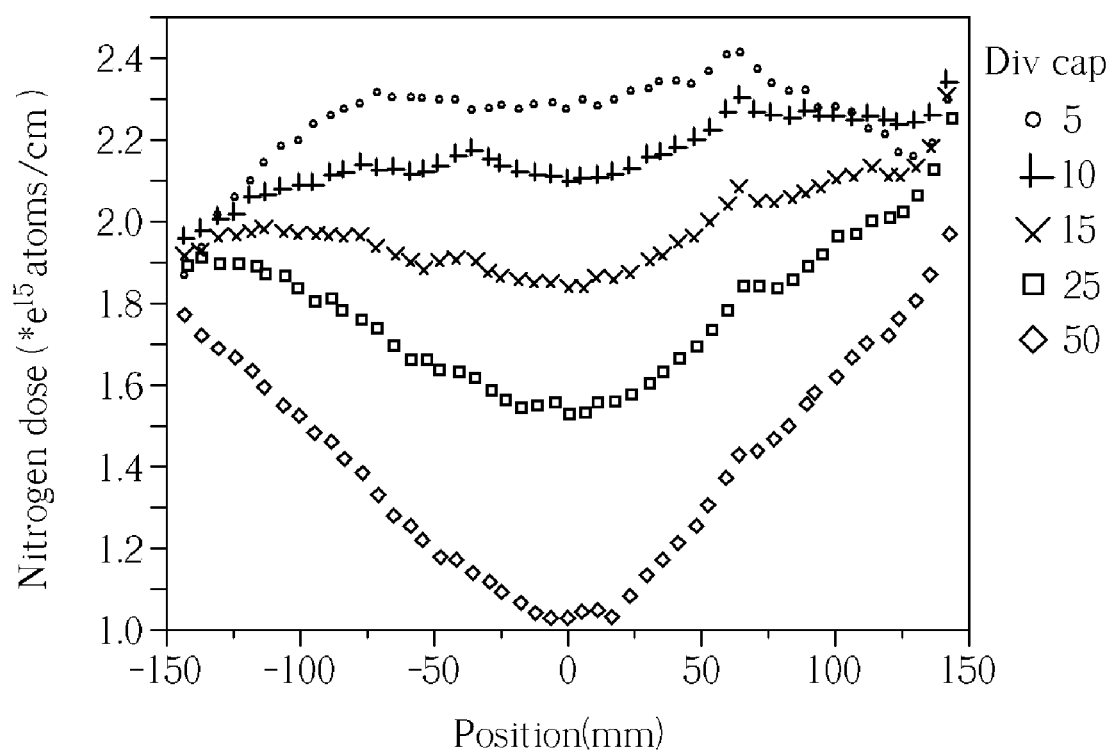
FIG. 1 is a flowchart illustrating a preferred embodiment according to the present invention.

In addition, performing the nitridation process with different divcap will result in different nitrogen distributions. Please refer to FIG. 1. FIG. 1 illustrates the nitrogen distribution in a silicon oxide layer when performing the nitridation process using a DPN device with divcap of 5~50%. According to FIG. 1, in the nitridation process performed under low divcap doping more nitrogen is around the center of a wafer. On the contrary, in the nitridation process performed under high divcap doping more nitrogen is around the peripheral of a wafer. Therefore, after two steps of nitridation, a low-divcap step and a high-divcap step, the nitridation distribution is much more uniform. For example, performing a nitridation process under low divcap of 0~10%, and then performing a nitridation process under high divcap of 15~50% is able to obtain a better nitridation distribution.

Figure 2:
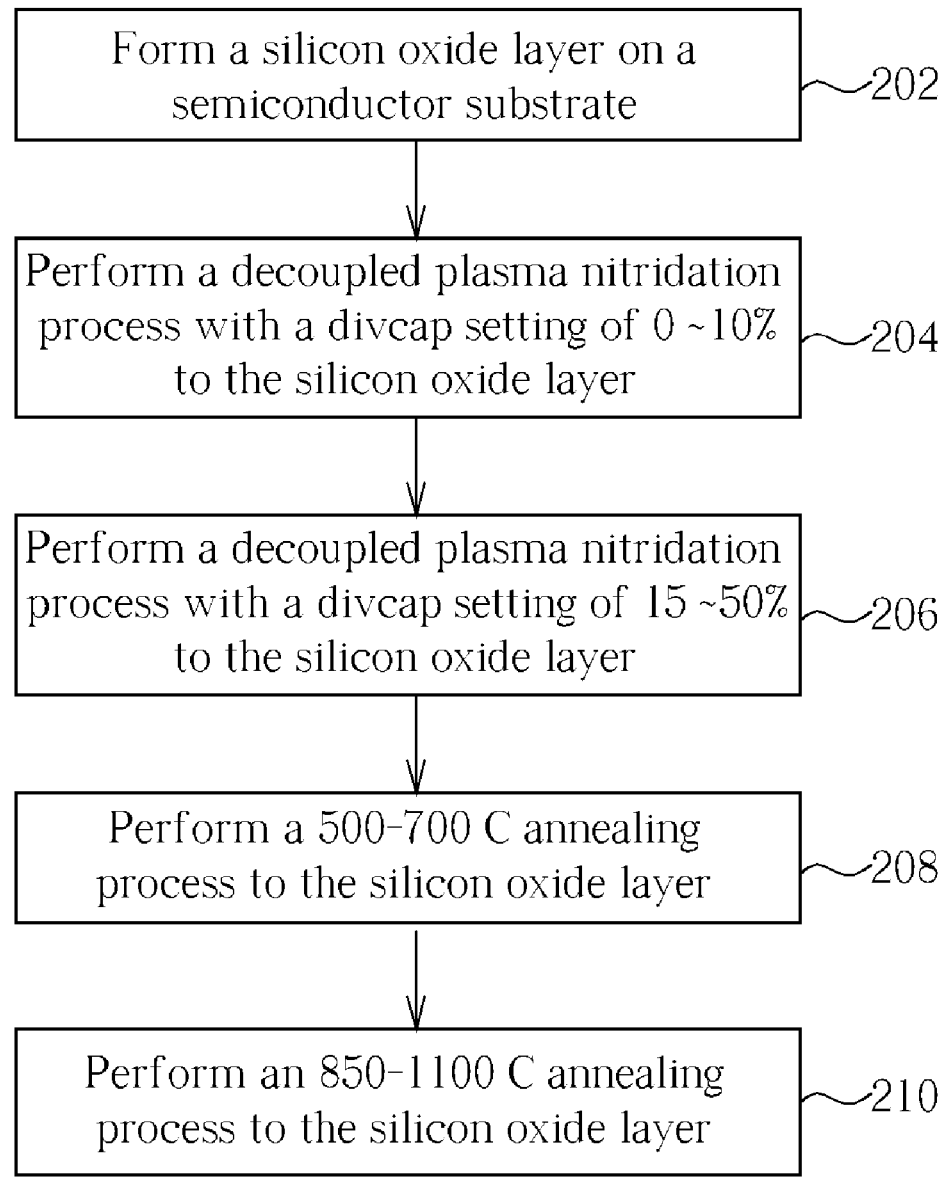
FIG. 2 is a graph illustrating nitrogen distribution in an oxide layer after nitridation processes performed under divider capacitor (divcap) settings from 5~50%.

Please refer to FIG. 2. FIG. 2 is a flowchart of an embodiment according to the present invention. According to FIG. 2, a traditional thermal growth process is performed to form a silicon oxide layer on a semiconductor substrate in a 90 nm process (step 202). A DPN process with a divider capacitor (divcap) setting of 0~10% is then performed to dope the silicon oxide layer with nitrogen, so as to complete a first nitridation process (step 204). After the first nitridation process is completed, nitrogen concentration is higher around the center of the wafer than around the peripheral of the wafer. Following that, a DPN process with a divcap setting of 15~50% is performed to dope the silicon oxide layer with nitrogen, so as to complete a second nitridation process (step 206). The second nitridation process dopes more nitrogen in the peripheral of the wafer, and thus uniform the nitrogen concentration around the center and the peripheral of the wafer. After the two steps of nitridation processes are completed, the uniformity of nitrogen in the silicon oxide is up to 4.3%, which is better than the traditional 8.1%. However, the sequence of the two nitridation processes is adjustable. In another words, the nitridation process with a divcap setting of 15~50% can be performed before the one with a divcap setting of 0~10%.

In addition, an annealing process can further improve the uniformity of nitrogen distribution in a gate oxide layer, and even the uniformity of the profile of the gate oxide layer. Therefore, according to the present invention, two annealing processes are performed after the two nitridation processes, so as to improve the uniformity of the nitrogen distribution and the profile of the wafer surface. Please refer to FIG. 1 again. According to FIG. 1, a low-temperature annealing process, from 500 to 700 C, is performed to the silicon oxide layer (step 208). Following that, a high-temperature annealing process, from 850 to 1100 C, is performed to the silicon oxide layer (step 210). After the two annealing processes, the uniformity of the nitrogen distribution is up to 3.8%. However, the sequence of the two annealing processes is adjustable. In another words, the annealing process performed under 850 to 1100 C may be performed before the one performed under 500 to 700 C.

Figure 3:
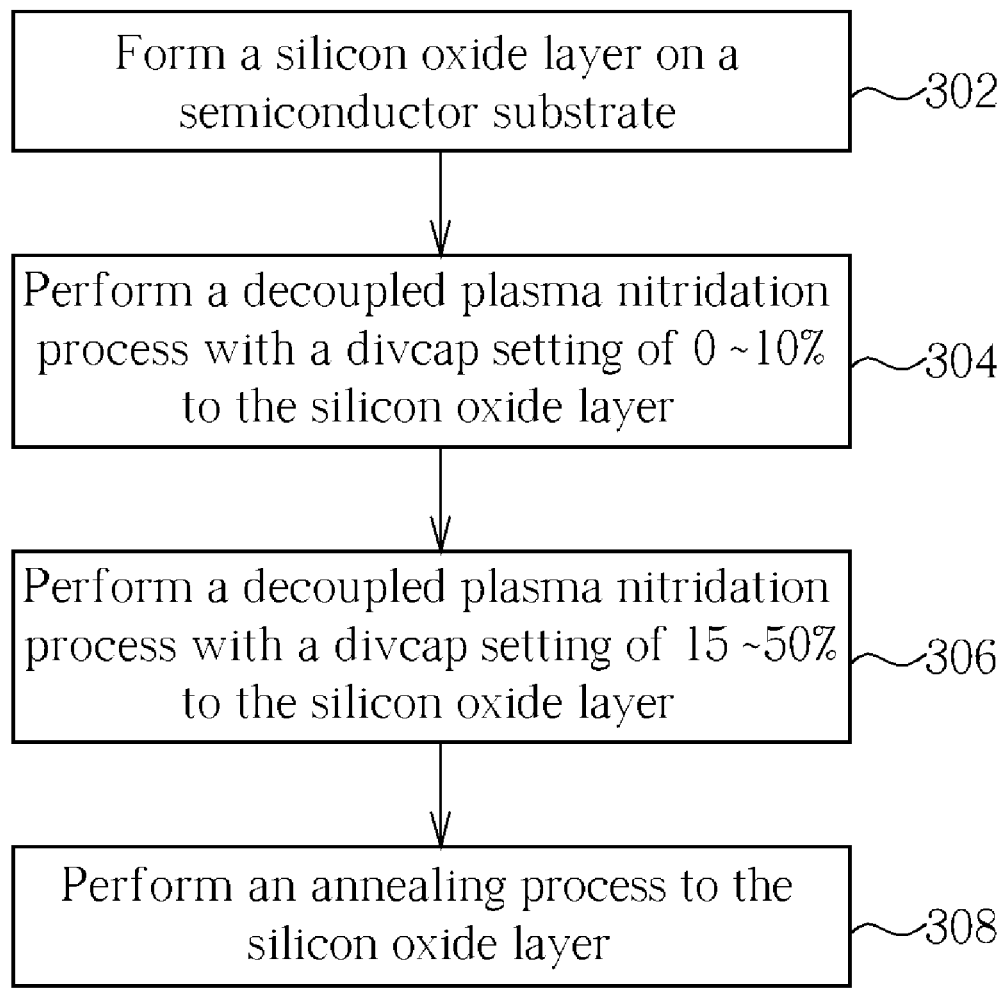
FIG. 3 is a flowchart illustrating another embodiment according to the present invention.

Please refer to FIG. 3. FIG. 3 illustrates a flowchart of another embodiment according to the present invention. According to FIG. 3, a silicon oxide is formed on a semiconductor substrate using a traditional thermal growth process (step 302). A DPN process with a divcap setting of 0~10% is then performed to dope the silicon oxide layer with nitrogen, so as to complete a first nitridation process (step 304). Following that, a DPN process with a divcap setting of 15~50% is performed to dope the silicon oxide layer with nitrogen, so as to complete a second nitridation process (step 306). Similarly, the sequence of the two nitridation processes is adjustable. In another words, the nitridation process with a divcap setting of 15~50% can be performed before the one with a divcap setting of 0~10%. At last, an annealing process is performed to the silicon oxide layer (step 308). According to the present invention, performing two nitridation processes followed by an annealing process improves the nitrogen distribution uniformity, so as to solve the problem faced in the prior art.

Compared to the traditional process, the method according to the present invention improves the uniformity of nitrogen distribution in the gate oxide layer. As a result, the electric properties of the gate oxide layer, such as capacitance and threshold voltage, are improved as well. In addition, the present invention can be performed using a conventional DPN device, and thus it is easy to practice and able to meet the requirements of mass production.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a dielectric layer doped with nitrogen, comprising:
   forming a dielectric layer on a semiconductor substrate;
   performing a first nitridation process on the dielectric layer;
   performing a second nitridation process on the dielectric layer;
   performing a low-temperature annealing process on the dielectric layer; and
   performing a high-temperature annealing process on the dielectric layer;
   wherein the first nitridation process and the second nitridation process are decoupled plasma nitridation processes, which are performed with a device having a dual-coil configuration that comprises an inner coil and an outer coil with adjustable current ratio.

2. The method according to claim 1, wherein the dielectric layer is an oxide layer comprising silicon oxide, and the oxide layer is a gate oxide layer.

3. The method according to claim 1, wherein the first nitridation process is a decoupled plasma nitridation process with a current ratio of 0-10%, and the second nitridation process is a decoupled plasma nitridation process with a current ratio of 15-50%.

4. The method according to claim 1, wherein the first nitridation process is a decoupled plasma nitridation process with a current ratio of 15-50%, and the second nitridation process is a decoupled plasma nitridation process with a current ratio of 0-10%.

5. The method according to claim 1, wherein a duration of the first nitridation process and a duration of the second nitridation are the same and in the range of 15-1000 seconds.

6. The method according to claim 1, wherein the low-temperature annealing process is performed at 500-700 C, and the high-temperature annealing process is performed at 850-1100 C.

7. A method for fabricating a dielectric layer doped with nitrogen, comprising:
   forming a dielectric layer on a semiconductor substrate;
   performing a first nitridation process on the dielectric layer;
   performing a second nitridation process on the dielectric layer; and
   performing an annealing process on the dielectric layer;
   wherein the first nitridation process and the second nitridation process are decoupled plasma nitridation processes, which are performed with a device having a dual-coil configuration that comprises an inner coil and an outer coil with adjustable current ratio.

8. The method according to claim 7, wherein the dielectric layer is an oxide layer comprising silicon oxide, and the oxide layer is a gate oxide layer.

9. The method according to claim 7, wherein the first nitridation process is a decoupled plasma nitridation process with a current ratio of 0-10%, and the second nitridation process is a decoupled plasma nitridation process with a current ratio of 15-50%.

10. The method according to claim 7, wherein the first nitridation process is a decoupled plasma nitridation process with a current ratio of 15-50%, and the second nitridation process is a decoupled plasma nitridation process with a current ratio of 0-10%.

11. The method according to claim 7, wherein a duration of the first nitridation process and a duration of the second nitridation are the same and in the range of 15-1000 seconds.

12. The method according to claim 7, wherein the annealing process comprises a low-temperature annealing process performed at 500-700 C and a high-temperature annealing process performed at 850-1100 C.

* * * * *